US011342600B2

(12) United States Patent
Liu et al.

(10) Patent No.: US 11,342,600 B2
(45) Date of Patent: May 24, 2022

(54) SWITCH

(71) Applicant: NXP USA, Inc., Austin, TX (US)

(72) Inventors: Hongwei Liu, Toulouse (FR); Olivier Tico, St Lys (FR); Stephan Ollitrault, Seysses (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/341,632

(22) Filed: Jun. 8, 2021

(65) Prior Publication Data

US 2022/0006132 A1  Jan. 6, 2022

(30) Foreign Application Priority Data

Jul. 1, 2020  (EP) ...................................... 20305741

(51) Int. Cl.
| | |
|---|---|
| *H03K 17/00* | (2006.01) |
| *H03K 17/06* | (2006.01) |
| *H03K 17/16* | (2006.01) |
| *H03K 17/687* | (2006.01) |
| *H03K 17/693* | (2006.01) |
| *H01M 10/48* | (2006.01) |
| *H02J 7/00* | (2006.01) |
| *H03K 17/10* | (2006.01) |

(52) U.S. Cl.
CPC ......... *H01M 10/482* (2013.01); *H02J 7/0018* (2013.01); *H03K 17/102* (2013.01); *H03K 17/6872* (2013.01); *H03K 2217/0009* (2013.01)

(58) Field of Classification Search
None
See application file for complete search history.

(56) References Cited

U.S. PATENT DOCUMENTS

| | | | |
|---|---|---|---|
| 6,759,888 B1 * | 7/2004 | Wodnicki ........... | H03K 17/6874 327/434 |
| 7,521,984 B2 | 4/2009 | Ricotti | |
| | (Continued) | | |

FOREIGN PATENT DOCUMENTS

JP    2005017289 A    1/2005

OTHER PUBLICATIONS

U.S. Appl. No. 17/341,635, filed Jun. 8, 2021.
Notice of Allowance U.S. Appl. No. 17/341,635 dated Mar. 30, 2022, 10 pages.

*Primary Examiner* — Kenneth B Wells (57) ABSTRACT

A switch comprising: a channel path comprising first and second MOS transistors with common source and gate terminals and drain terminals defining first and second terminals of the channel path; and control circuitry comprising: a third MOS transistor comprising: a gate coupled to the common source terminal; a source coupled to the common gate terminal by a resistor; and a drain coupled to a first reference terminal; a first current source coupled between the first reference terminal and the common gate terminal for providing a first current; a second current source coupled between the source terminal of the third MOS transistor and a second reference terminal for providing a second current greater than the first current; and a first switching arrangement configured to selectively enable and disable the first current source; and a second switching arrangement configured to selectively couple the common source terminal to the second reference terminal.

20 Claims, 3 Drawing Sheets

(56) References Cited

U.S. PATENT DOCUMENTS

| | | | |
|---|---|---|---|
| 7,924,082 B2* | 4/2011 | Ricotti | H03K 17/04206 |
| | | | 327/427 |
| 8,035,423 B2* | 10/2011 | Ricotti | G01S 7/5202 |
| | | | 327/108 |
| 8,981,732 B2 | 3/2015 | Ono et al. | |
| 9,178,507 B2* | 11/2015 | Taylor | G01S 7/5202 |
| 9,680,466 B2* | 6/2017 | Tokai | H03K 17/693 |
| 9,954,519 B2 | 4/2018 | Terenzi et al. | |
| 10,097,178 B1 | 10/2018 | Ou et al. | |
| 10,517,570 B2* | 12/2019 | Kajiyama | A61B 8/5207 |
| 11,171,645 B1* | 11/2021 | Liu | H03K 17/687 |
| 2004/0257042 A1 | 12/2004 | Liu et al. | |
| 2013/0049760 A1 | 2/2013 | Ono et al. | |

\* cited by examiner

SWITCH

FIELD

The present disclosure relates to a switch and in particular to an analog switch for use in a high voltage multiplexer of a battery management system.

SUMMARY

According to a first aspect of the present disclosure there is provided a switch comprising:
- a channel path comprising a first MOS transistor and a second MOS transistor arranged in a back to back configuration with a common source terminal and a common gate terminal, wherein a drain terminal of the first MOS transistor defines a first terminal of the channel path and a drain terminal of the second MOS transistor defines a second terminal of the channel path; and
- control circuitry comprising:
  - a third MOS transistor comprising:
    - a gate terminal coupled to the common source terminal;
    - a source terminal coupled to the common gate terminal by a resistor; and
    - a drain terminal coupled to a first reference voltage terminal;
  - a first current source coupled between the first reference voltage terminal and the common gate terminal and configured to provide a first current;
  - a second current source coupled between the source terminal of the third MOS transistor and a second reference voltage terminal, and configured to provide a second current greater than the first current; and
  - a first switching arrangement configured to selectively enable and disable the first current source; and
  - a second switching arrangement configured to selectively couple the common source terminal to the second reference voltage terminal.

Such a high-voltage switch can advantageously: (i) inject zero or minimal control current into a channel path of the switch; and (ii) consume zero or minimal current when in an open or OFF state.

In one or more embodiments the first switching arrangement and the second switching arrangement may be configured to receive state signalling defining a state of the switch.
The first switching arrangement may be configured to:
enable the first current source if the state signalling defines an ON state; and
disable the first current source if the state signalling defines an OFF state. and
The second switching arrangement may be configured to:
decouple the common source terminal from the second reference voltage terminal if the state signalling defines an ON state; and
couple the common source terminal to the second reference voltage terminal if the state signalling defines an OFF state.

In one or more embodiments a voltage of the first reference voltage terminal may be greater than a voltage of the second reference voltage terminal. The first MOS transistor, the second MOS transistor and the third MOS transistor may be NMOS transistors.

In one or more embodiments the second switching arrangement may comprise a fourth NMOS transistor having a gate terminal configured to receive the state signalling, wherein a conduction channel of the fourth NMOS transistor is coupled between the common source terminal and the second reference voltage terminal.

In one or more embodiments the first current source may comprise an output PMOS transistor of a PMOS current mirror.

In one or more embodiments the first switching arrangement may comprise a fifth NMOS transistor having a gate terminal configured to receive the state signalling. A conduction channel of the fifth NMOS transistor, a conduction channel of an input PMOS transistor of the PMOS current mirror and a primary current source may be coupled in series between the first reference voltage terminal and the second reference voltage terminal such that the PMOS current mirror is configured to mirror a current of the primary current source from the input PMOS transistor to the output PMOS transistor to produce the first current.

In one or more embodiments the state signalling may comprise a two-level signal. The fourth NMOS transistor may be configured to receive the state signalling with a first level representing an ON state and a second level representing an OFF state. The fifth NMOS may be configured to receive the state signalling as complementary state signalling with the first level representing the OFF state and the second level representing the ON state.

In one or more embodiments a voltage of the first reference voltage terminal may be less than a voltage of the second reference voltage terminal. The first MOS transistor, the second MOS transistor and the third MOS transistor may be PMOS transistors.

In one or more embodiments the first switching arrangement may comprise a sixth NMOS transistor having a gate terminal configured to receive the state signalling, wherein a conduction channel of the sixth NMOS transistor and the first current source are coupled in series between the first reference voltage terminal and the common gate terminal.

In one or more embodiments the second switching arrangement may comprise a fourth PMOS transistor having a gate terminal configured to receive the state signalling wherein a conduction channel of the fourth PMOS transistor is coupled between the common source terminal and the second reference voltage terminal.

In one or more embodiments the second switching arrangement may further comprise a seventh PMOS transistor having a gate terminal configured to receive the state signalling wherein a conduction channel of the seventh PMOS transistor is configured is coupled between the source terminal of the third PMOS transistor and the second reference voltage.

In one or more embodiments the second current source may comprise an output PMOS transistor of a PMOS current mirror.

In one or more embodiments a conduction channel of an input PMOS transistor of the PMOS current mirror and a primary current source may be coupled in series between the first reference voltage terminal and the second reference voltage terminal such that the PMOS current mirror is configured to mirror the primary current source from the input PMOS transistor to the output PMOS transistor to produce the second current.

In one or more embodiments the second switching arrangement may further comprise a fifth NMOS transistor having a gate terminal configured to receive the state signalling. A conduction channel of the fifth NMOS transistor, a conduction channel of an input PMOS transistor of the PMOS current mirror and a primary current source may be coupled in series between the first reference voltage terminal and the second reference voltage terminal such that the PMOS current mirror is configured to mirror a current of the primary current source from the input PMOS transistor to the output PMOS transistor to produce the second current.

In one or more embodiments the switch may further comprise a Zener diode coupled between the gate terminal of the third MOS transistor and the source terminal of the third MOS transistor and arranged to provide over-voltage gate protection for the third MOS transistor.

In one or more embodiments the state signalling may comprise a two-level signal. The fifth NMOS transistor and the sixth NMOS transistor may be configured to receive the state signalling with a first level representing an ON state and a second level representing an OFF state. The fourth PMOS transistor and the seventh PMOS transistor may be configured to receive the state signalling as complementary state signalling with the first level representing the OFF state and the second level representing the ON state.

In one or more embodiments the switch may comprise an analog switch.

According to a second aspect of the present disclosure there is provided a high voltage multiplexer comprising any of the switches disclosed herein.

According to a further aspect of the present disclosure there is provided a battery management system comprising any of the switches disclosed herein or any of the high voltage multiplexers disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

High voltage battery management systems (BMSs) can be required in applications having a plurality of battery cells assembled together to form a battery pack. One such application is in the battery packs of electric and hybrid vehicles. BMSs may have a requirement to monitor and manage the performance of the individual battery cells of the stacked cell battery packs. For example, BMSs can be required to measure stacked cell voltages corresponding to the voltages of individual battery cells and of various combinations of the individual cells. BMS ICs can employ switches to multiplex the cell voltages to an analog to digital converter (ADC).

Previous generations of high-voltage BMSs used low-voltage (LV) multiplexers that were limited to multiplexing two cells together at a maximum voltage of 10V. Each LV multiplexer would connect the successive cells to a level shifter. Therefore, for a battery pack containing 14 cells, 7 level shifters were required between the LV multiplexers and the ADC.

Figure 1:
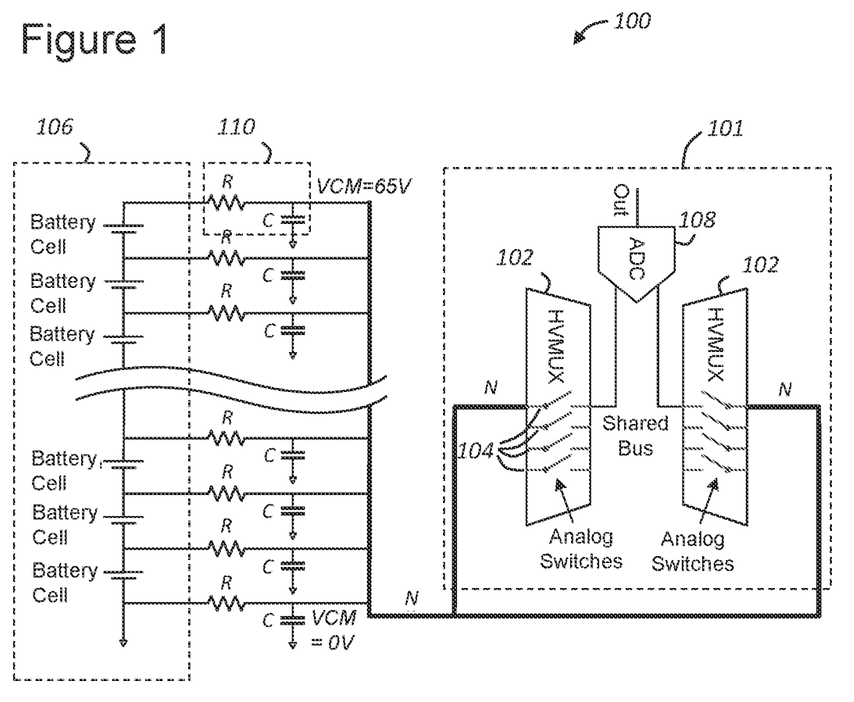
FIG. 1 illustrates an example battery management system integrated circuit and its associated application schematic.

FIG. 1 illustrates a BMS 100 with an improved BMS integrated circuit (IC) 101 incorporating a high voltage (HV) multiplexer 102 that can multiplex a wide range of differential voltages to a shared bus. The BMS IC 101 may only have one or two level shifters (not shown) resulting in a significant reduction in required die area compared to LV multiplexer solutions.

The HV multiplexer 102 comprises a plurality of analog switches 104. Each analog switch 104 may be coupled to a corresponding battery cell of a battery pack 106 (individual connections not illustrated in FIG. 1 but are contained within connection labelled N). Each battery cell may be connected to two analog switches 104 such that each battery cell may contribute to a high side voltage and/or a low side voltage of a differential voltage. In this way, the HV multiplexer 102 can multiplex a wide range of differential voltage to a shared bus, which is then converted by an ADC 108 for measurement.

The high-voltage analog switches 104 can be controlled by current sources to enable operation over a wide range of common mode voltages (VCM). This is in contrast to a LV switch design driven by a fixed voltage.

The BMS IC 101 can convert and sense each cell voltage through a corresponding low pass RC filter 110 with a high level of accuracy. However, any control current of the analog switch 104 that is injected into the channel path of the analog switch 104 can lead to measurement inaccuracies. For example, the injected current may cause an error voltage across the switch 104 drain-source on resistance (Rdson) or across the low pass RC filter 110.

Therefore, analog switches 104 that can provide a low level of control current injection into the channel path can provide greater measurement accuracy.

When the BMS IC 101 is not converting or sensing cell voltages, for example in a sleep mode, current consumption of the BMS IC 101 should be kept as low as possible. As the BMS IC 101 comprises a plurality of analog switches 104, any current consumption of the analog switch 104 in the OFF state will be multiplied up several-fold. Therefore, the current consumption of the analog switches 104 should be as low as possible when channels are switched off.

The present disclosure provides a high-voltage switch that: (i) injects zero or minimal control current into a channel path of the switch; and (ii) consumes zero or minimal current when in an open or OFF state.

The switch comprises a channel path and control circuitry. The channel path comprises a first terminal and a second terminal. The switch may be used in a HV multiplexer of a BMS with the first terminal of the channel path connected to a battery cell and the second terminal of the channel path connected to the shared bus. The control circuitry controls the operation of the switch between an ON state and an OFF state.

The channel path comprises a first MOS transistor (metal-oxide-semiconductor transistor, metal-oxide-silicon transistor or equivalently metal-oxide-semiconductor field-effect transistor, MOSFET) and a second MOS transistor (also known as channel switches) arranged in a back to back configuration with a common gate terminal and a common source terminal. In other words, the gate terminals of the first and second MOS transistors are connected together at a common (same) voltage and the source terminals of the first and second MOS transistors are connected together at another common voltage. The back to back configuration can avoid a drain to body diode of a MOS transistor conducting in one direction when the switch is commanded off, when a gate-source voltage is less than a threshold voltage (Vgs<Vth). Conduction channels of the first MOS transistor and the second MOS transistor form the channel path. Drain terminals of the first and second MOS transistors can form the first and second terminals of the channel path.

The control circuitry comprises a third MOS transistor, a drive resistor, a first current source, a second current source, a first switching arrangement and a second switching arrangement. The control circuitry can control the operation of the switch between an ON state and an OFF state while preventing or minimising control current injection into the channel path and current consumption during the OFF state.

The third MOS transistor comprises: a gate terminal coupled to the common source terminal of the first and second MOS transistors; a source terminal coupled to a first end of the drive resistor, with a second end of the drive resistor coupled to the common gate terminal of the first and second MOS transistors; and a drain terminal coupled to a first reference voltage terminal. As discussed below, the first reference voltage terminal may be a supply terminal or a reference (or ground) terminal depending upon whether the switch is implemented with PMOS or NMOS transistors. A Zener diode may couple together the gate terminal and the source terminal of the third MOS transistor and provide over-voltage gate protection for the third MOS transistor.

The first current source is coupled between the first reference voltage terminal and the common gate terminal and can provide a first current. The second current source is coupled between the source terminal of the third MOS transistor and a second reference voltage terminal and can provide a second current. The second current should be greater than the first current to provide correct biasing of the third MOS transistor. As discussed below, the second reference voltage terminal may be a supply terminal or a reference terminal depending upon whether the switch is implemented with PMOS or NMOS transistors. As a result, a direction of flow of the first and second current source may depend upon whether the switch is implemented with NMOS or PMOS transistors.

The first switching arrangement can selectively enable and disable the first current source depending on a ON/OFF state of the switch. The second switching arrangement can selectively couple the second reference voltage terminal to the common source terminal of the first and second MOS transistors depending on the ON/OFF state of the switch.

Figure 2:
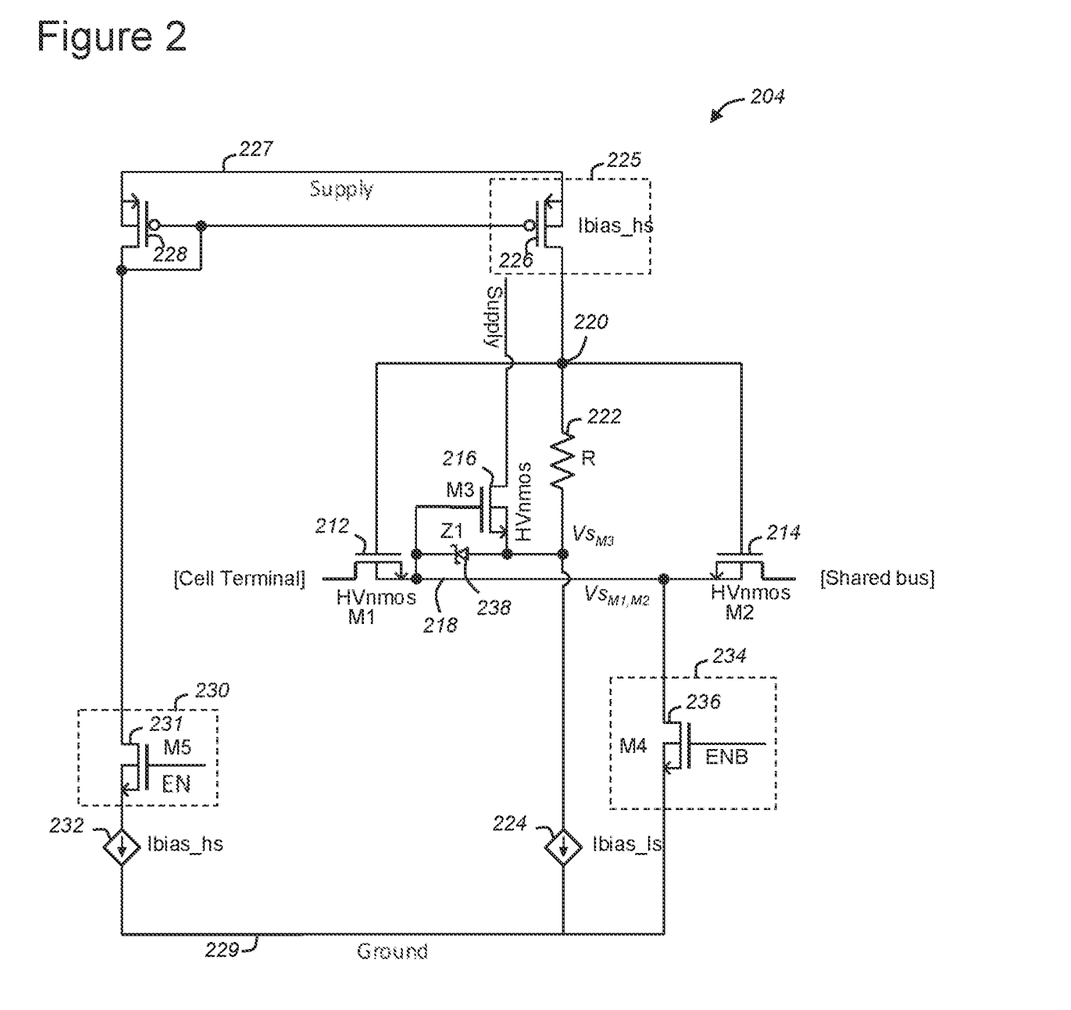
FIG. 2 illustrates a switch comprising NMOS channel switches according to an embodiment of the present disclosure.

FIG. 2 illustrates a switch 204 according to an embodiment of the present disclosure. In this example, the first, second and third MOS transistors are respectively implemented as a first NMOS (n-type MOS) transistor, M1, 212, a second NMOS transistor, M2, 214 and a third NMOS transistor, M3, 216.

The first NMOS transistor 212 and the second NMOS transistor 214 form the channel path having a common source terminal 218 and a common gate terminal 220. Drain terminals of the first and second NMOS transistors 212, 214 may form the respective first and second terminals of the channel path.

The control circuitry comprises the third NMOS transistor 216 and the drive resistor, R, 222. The drain terminal of the third NMOS transistor 216 is coupled to the first reference voltage terminal 227, which in this example is a supply voltage terminal. The gate terminal of the third NMOS transistor 216 is coupled to the common source terminal 218. The drive resistor 222 couples the source terminal of the third NMOS transistor 216 to the common gate terminal 220. The source terminal of the third NMOS transistor 216 is coupled to the second reference voltage terminal 229 (ground in this example) by the second current source 224. In this way, the third NMOS transistor 216 can act as a source follower biased by the second current source 224, with a voltage, $Vs_{M1,M2}$, at the common source terminal 218 as an input signal and a voltage, $Vs_{M3}$, at the source terminal of the third NMOS transistor 216 as an output signal.

In this example, a Zener diode 238 is coupled between the gate terminal and the source terminal of the third NMOS transistor 216. An anode of the Zener diode 238 is coupled to the source terminal of the third NMOS transistor 216, and a cathode of the Zener diode 238 is coupled to the gate terminal of the third NMOS transistor 216. The Zener diode 238 can provide over-voltage gate protection for the third NMOS transistor 216. In this way a maximum value of the gate-source voltage, $Vgs_{M3}$, of the third NMOS transistor 216 will be limited to a Zener diode breakdown voltage. The Zener breakdown voltage should be higher than an operation value of gate-source voltage, $Vgs_{M3}$, of the third NMOS transistor 216 and lower than a maximum rating of the gate-source voltage, $Vgs_{M3}$, of the third NMOS transistor 216.

In this example, the first current source 225 is provided by a conduction channel of an output PMOS (p-type MOS) transistor 226. The output PMOS transistor 226 forms part of a PMOS current mirror. The PMOS current mirror further comprises an input PMOS transistor 228. Source terminals of the input PMOS transistor 228 and the output PMOS transistor 226 are coupled to the supply voltage terminal. A drain of the output PMOS transistor 226 is coupled to the common gate terminal 220. Gate terminals of the input PMOS transistor 228 and the output PMOS transistor 226 are coupled together and to a drain terminal of the input PMOS transistor 228. The PMOS current mirror further comprises a primary current source 232 selectively coupled (by the first switching arrangement 230) in series between the drain terminal of the input PMOS transistor 228 and the ground terminal.

The first switching arrangement 230 comprises a fifth NMOS transistor, M5, 231 with a conduction channel coupled in series with the primary current source 232. A gate terminal of the fifth NMOS transistor 231 can receive state signalling, EN, indicative of whether the switch is in an ON state or an OFF state. The state signalling may comprise a two-level signal with a first level representing an ON state and a second level representing an OFF state. In this way, the PMOS current mirror can selectively mirror a current, Ibias_hs, of the primary current source 232 from the input PMOS transistor 228 to the output PMOS transistor 226 to provide the first current, Ibias_hs, depending on the state signalling. In this example, the first switching arrangement 230 can selectively: (i) enable the first current source 225 to produce the first current, Ibias_hs, (by enabling the primary current source 232) when the state signalling, EN, is a high level, or a logic 1, indicative of an ON state of the switch 204; and (ii) disable the first current source 225 from producing the first current, Ibias_hs, when the state signalling, EN, is a low level, or a logic 0, indicative of an OFF state of the switch 204.

In other examples, the first current source 225 may be provided by alternative means to the PMOS mirror.

The second switching arrangement 234 comprises a fourth NMOS transistor, M4, 236 with a drain terminal coupled to the common source terminal 218 and a source terminal coupled to the ground terminal. A gate terminal of the fourth NMOS transistor 236 can receive the state signalling. In this example, the fourth NMOS transistor 236 may receive complementary state signalling, ENB, that is a complementary signal of the state signalling, EN, received by the fifth NMOS transistor 231. In this way, the second switching arrangement 234 can selectively: (i) couple the common source terminal 218 to the ground terminal when the complementary state signalling, ENB, is a high level, or a logic 1, indicative of an OFF state of the switch 204; and (ii) decouple the common source terminal 218 from the ground terminal when the complementary state signalling, ENB, is a low level, or logic 0, indicative of an ON state of the switch 204.

Providing the fourth and the fifth NMOS transistors 236, 231 as NMOS transistors that receive the respective state signalling and complementary state signalling as described in can allow the state signalling to be provided in a straightforward manner and within the limits of the first and second reference voltages.

When the switch 204 is closed or set to an ON state, the state signalling EN is a logic 1 and the complementary state signalling ENB is a logic 0. On receipt of the state signalling, EN=1, the fifth NMOS transistor 231 couples the primary current source 232 to the drain of the input PMOS transistor 228. The PMOS current mirror mirrors the current, Ibias_hs, of the primary current source 232 from the input PMOS transistor 228 to the output PMOS transistor 226 to provide the first current, Ibias_hs. In this way, the first switching arrangement 230 is configured to selectively enable the first current source 225. In this example, the PMOS mirror does not scale the current of the primary current source 232, but in other examples the first current, Ibias_hs, may differ from the current of the primary current source 232.

On receipt of the complementary state signalling, ENB=0, the fourth NMOS transistor 236 of the second switching arrangement 234 decouples the common source terminal 218 from the second reference voltage terminal 229.

The first current, Ibias_hs, is injected into the drive resistor 222 providing a voltage across drive resistor 222. This voltage provides a gate-source voltage, $Vgs_{M1,M2}$, for the first and second NMOS transistors 212, 214 that is greater than their threshold voltage, Vth, and the channel path of the switch 204 becomes conductive. In other words, the first and second NMOS transistors are switched ON and their conduction channels forming the channel path become conductive. The gate-source voltage, $Vgs_{M1,M2}$, controls the first and second NMOS transistors 212, 214 based on a resistance, R, of the drive resistor 222, the first current, Ibias_hs, and a gate-source voltage, $Vgs_{M3}$, of the third NMOS transistor 216, according to the equation:

$$Vgs_{M1,M2}=(Ibias\_hs*R)-Vgs_{M3}$$

The second current source 224 provides a second current, Ibias_ls, for sinking the first current, Ibias_hs, and biasing the third NMOS transistor 216. The second current source 224 provides a second current, Ibias_ls, greater than the first current, Ibias_hs. As a result, during the ON state, a current (Ibias_ls−Ibias_hs) will flow from the supply voltage terminal through the third NMOS transistor 216 towards the second current source 224. In this way, the third NMOS transistor can isolate the first and second current from the channel path of the switch 204. The first and second current may be considered as the control current of the control circuitry. Therefore, the control circuitry can isolate the control current from the channel path of the switch 204.

When the switch 204 is opened or set to an OFF state, the state signalling EN is a logic 0 and the complementary state signalling ENB is a logic 1. On receipt of the state signalling, EN=0, the fifth NMOS transistor decouples the primary current source 232 from the drain of the input PMOS transistor 228. As a result, there is no current for the PMOS mirror to mirror to the output PMOS transistor 226. In this way, the first switching arrangement 230 is configured to selectively disable the first current source 225.

On receipt of the complementary state signalling, ENB=1, the fourth NMOS transistor 236 of the second switching arrangement 234 couples the common source terminal 218 to the second reference voltage terminal 229. As a result, a voltage, $VS_{M1,M2}$, at the common source terminal 218 of the first and second NMOS transistors 212, 214 is pulled to ground. As the first current source 225 is disabled, the second current source 224 also automatically pulls a voltage, $Vs_{M3}$, at the source terminal of the third NMOS transistor 216 to ground. As a result, the second current source 224 stops providing the second current, Ibias_ls, because there is no voltage difference across its terminals. Neither the first current, Ibias_hs, nor the second current, Ibias_ls, flow in the OFF state. In other words, the control circuit does not consume current during the OFF state of the switch 204.

As no more current is injected through the drive resistor 222 and the voltages, $Vs_{M1,M2}=Vs_{M3}=0$, the gate-source voltage, $Vgs_{M1,M2}$, of the first and second NMOS transistors 212, 214 equals 0 V. As a result, the first and second NMOS transistors 212, 214 are switched off and their conduction channels forming the channel path of the switch become non-conductive. The zero value of the gate-source voltage, $Vgs_{M1,M2}$, of the first and second NMOS transistors 212, 214 can ensure a proper cut-off of the channel switches 212, 214.

Figure 3:
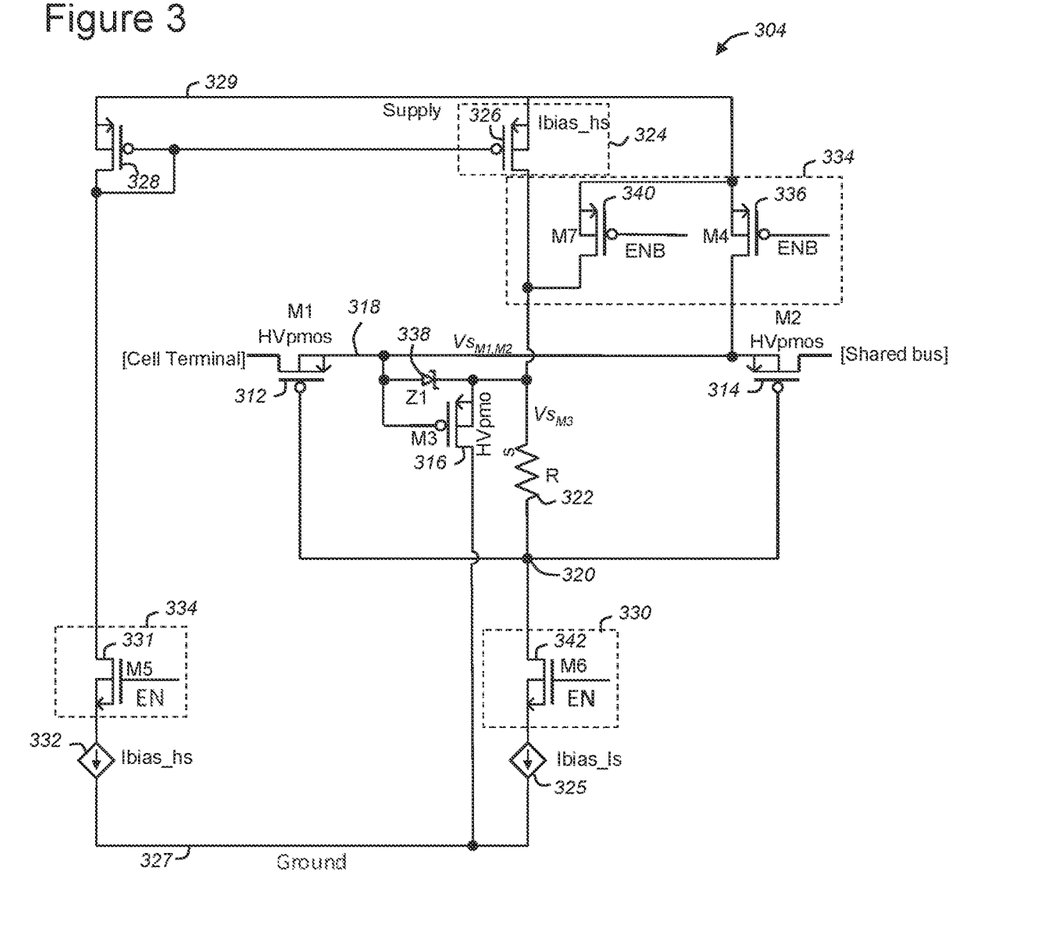
FIG. 3 illustrates a switch comprising PMOS channel switches according to an embodiment of the present disclosure.

FIG. 3 illustrates a switch 304 according to another embodiment of the present disclosure. In this example, the first, second and third MOS transistors are respectively implemented as a first PMOS transistor, M1, 312, a second PMOS transistor, M2, 314 and a third PMOS transistor, M3, 316. It will be appreciated that the switch 304 of FIG. 3 provides essentially the same functionality as the switch of FIG. 2 but implemented with PMOS transistors. Certain terminology such as the first and second reference voltage terminals, first and second currents and first and second switching arrangements of the switch 304 of FIG. 3 may correspond to opposite ones to the switch of FIG. 2.

The first PMOS transistor 312 and the second PMOS transistor 314 form the channel path having a common source terminal 318 and a common gate terminal 320. Drain terminals of the first and second PMOS transistors 312, 314 form the respective first and second terminals of the channel path.

The control circuitry comprises the third PMOS transistor 316 and drive resistor, R, 322. The drain terminal of the third PMOS transistor 316 is coupled to the first reference voltage terminal 327, which in this example is a ground terminal. The gate terminal of the third PMOS transistor 316 is coupled to the common source terminal 318. The drive resistor 322 couples the source terminal of the third PMOS transistor 316 to the common gate terminal 320. The source terminal of the third PMOS transistor 316 is coupled to a second reference voltage terminal 329 (a supply voltage terminal in this example) by the second current source 324. In this way, the third PMOS transistor 316 can act as a source follower biased by the second current source 324, with a voltage, $Vs_{M1,M2}$, at the common source terminal 318 as an input signal and a voltage, $Vs_{M3}$, at the source terminal of the third PMOS transistor 316 as an output signal.

In this example, a Zener diode 338 is coupled between the gate terminal and the source terminal of the third PMOS transistor 316. A cathode of the Zener diode 338 is coupled to the source terminal of the third PMOS transistor 316, and an anode of the Zener diode 338 is coupled to the gate terminal of the third PMOS transistor 316. The Zener diode 338 can provide over-voltage gate protection for the third PMOS transistor 316. In this way a maximum value of the gate-source voltage, $Vgs_{M3}$, of the third PMOS transistor 316 will be limited to a Zener diode breakdown voltage. The Zener breakdown voltage should be higher than an operation value of gate-source voltage, $Vgs_{M3}$, of the third PMOS transistor 316 and lower than a maximum rating of the gate-source voltage, $Vgs_{M3}$, of the third PMOS transistor 316.

In this example, the second current source 324 is provided by a conduction channel of an output PMOS transistor 326. The output PMOS transistor 326 forms part of a PMOS current mirror. The PMOS current mirror further comprises an input PMOS transistor 328. Source terminals of the input PMOS transistor 328 and the output PMOS transistor 326 are coupled to the supply voltage terminal. A drain of the output PMOS transistor 326 is coupled to the source terminal of the third PMOS transistor 316. Gate terminals of the input PMOS transistor 328 and the output PMOS transistor 326 are coupled together and to a drain terminal of the input PMOS transistor 328. The PMOS current mirror further comprises a primary current source 332 coupled in series between the drain terminal of the input PMOS transistor 328 and the ground terminal. In this example, the primary current source 332 is selectively coupled in series between the drain terminal of the input the input PMOS transistor 328 and the ground terminal by a portion of the second switching arrangement 334.

In this example, the second switching arrangement 334 comprises a fifth NMOS transistor, M5, 331 with a conduction channel coupled in series with the primary current source 332. A gate terminal of the fifth NMOS transistor 331 can receive state signalling, EN, indicative of whether the switch is in an ON state or an OFF state. The state signalling may comprise a two-level signal with a first level representing an ON state and a second level representing an OFF state. In this way, the PMOS current mirror can selectively mirror a current, Ibias_hs, of the primary current source 332 from the input PMOS transistor 328 to the output PMOS transistor 326 to provide the second current, Ibias_hs, depending on the state signalling. In this example, the second switching arrangement 334 can selectively: (i) enable the second current source 324 to produce the second current, Ibias_hs, (by enabling the primary current source 332) when the state signalling, EN, is a high level, or a logic 1, indicative of an ON state of the switch; and (ii) disable the second current source 324 from producing the second current, Ibias_hs, when the state signalling, EN, is a low level, or a logic 0, indicative of an OFF state of the switch.

In other examples, the second current source 324 may be provided by alternative means to the PMOS mirror.

In this example, the second switching arrangement 334 further comprises a fourth PMOS transistor, M4, 336 with a drain terminal coupled to the common source terminal 318 and a source terminal coupled to the second reference voltage terminal 329 (the supply terminal). A gate terminal of the fourth PMOS transistor 336 can receive the state signalling. In this example, the fourth PMOS transistor 236 may receive complementary state signalling, ENB, that is a complementary signal of the state signalling, EN, received by the fifth NMOS transistor 331. In this way, the second switching arrangement 334 can selectively: (i) couple the common source terminal 318 to the supply terminal when the complementary state signalling, ENB, is a high level, or a logic 1, indicative of an OFF state of the switch 304; and (ii) decouple the common source terminal 318 from the supply terminal when the complementary state signalling, ENB, is a low level, or logic 0, indicative of an ON state of the switch 304.

In this example, the second switching arrangement 334 further comprises a seventh PMOS transistor, M7, 340 with a drain terminal coupled to the source terminal of the third PMOS transistor 316 and a source terminal coupled to the second reference voltage terminal 329 (the supply terminal). A gate terminal of the fourth PMOS transistor 336 can receive the complementary state signalling, ENB. In this way, the second switching arrangement 334 can selectively: (i) couple the source terminal of the third PMOS transistor 316 to the supply terminal when the complementary state signalling, ENB, is a high level, or a logic 1, indicative of an OFF state of the switch 304; and (ii) decouple the source terminal of the third PMOS transistor 316 from the supply terminal when the complementary state signalling, ENB, is a low level, or logic 0, indicative of an ON state of the switch 304.

The first switching arrangement 330 comprises a sixth NMOS transistor, M6, 342 having a gate terminal configured to receive the state signalling, EN. A conduction channel of the sixth NMOS transistor 342 and the first current source 325 are coupled in series between the first reference voltage terminal 327 (the ground terminal) and the common gate terminal 320. In this way, the first switching arrangement can selectively: (i) enable the first current source 325 to produce the first current, Ibias_ls, when the state signalling, EN, is a high level, or a logic 1, indicative of an ON state of the switch 304; and (ii) disable the first current source 325 from producing the first current, Ibias_ls, when the state signalling, EN, is a low level, or a logic 0, indicative of an OFF state of the switch 304.

Providing the fifth and the sixth NMOS transistors 331, 342 as NMOS transistors that receive the signalling and the fourth and seventh PMOS transistors 336, 340 as PMOS transistors that receive the complementary state signalling as described can allow the state signalling to be provided in a straightforward manner and within the limits of the first and second reference voltages.

When the switch 304 is closed or set to an ON state, the state signalling EN is a logic 1 and the complementary state signalling ENB is a logic 0. On receipt of the state signalling, EN=1, the fifth NMOS transistor 331 couples the primary current source 332 to the drain of the input PMOS transistor 328. The PMOS current mirror mirrors the current, Ibias_hs, of the primary current source 332 from the input PMOS transistor 328 to the output PMOS transistor 326 to provide the second current, Ibias_hs. In this way, the second switching arrangement 334 is configured to selectively enable the second current source 324.

On receipt of the state signalling, EN=1, the sixth NMOS transistor 342 of the first switching arrangement 330 couples the first current source 325 to the common gate terminal 320. In this way, the first switching arrangement selectively enables the first current source 325.

On receipt of the complementary state signalling, ENB=0, the fourth PMOS transistor 336 of the second switching arrangement 334 decouples the common source terminal 318 from the second reference voltage terminal 329 (supply voltage terminal). Similarly, the seventh PMOS transistor 340 of the second switching arrangement 334 decouples the source terminal of the third PMOS transistor 316 from the supply voltage terminal on receipt of the complementary state signalling, ENB=0.

The second current, Ibias_hs, is injected into the drive resistor 322 providing a voltage across drive resistor 322. This voltage provides a gate-source voltage, $Vgs_{M1,M2}$, for the first and second PMOS transistors 312, 314 that is of greater magnitude (more negative) than their threshold voltage, Vth, and the channel path of the switch 304 becomes conductive. In other words, the first and second PMOS transistors are switched ON and their conduction channels forming the channel path become conductive. The gate-source voltage, $Vgs_{M1,M2}$, controls the first and second PMOS transistors 312, 314 based on a resistance, R, of the drive resistor 322, the first current, Ibias_hs, and a gate-source voltage, $Vgs_{M3}$, of the third PMOS transistor 316, according to the equation:

$$Vgs_{M1,M2} = Vgs_{M3} - (Ibias_{hs} * R)$$

The second current source 324 provides a second current, Ibias_hs, for biasing the third PMOS transistor 316. The second current source 324 provides a second current, Ibias_hs, greater than the first current, Ibias_ls. As a result, during the ON state, a current (Ibias_hs−Ibias_ls) will flow from the second current source 324, through the third PMOS transistor 316 to the ground terminal. In this way, the third PMOS transistor 316 can isolate the first and second current from the channel path of the switch 304. The first and second current may be considered as the control current of the control circuitry. Therefore, the control circuitry can isolate the control current from the channel path of the switch 304.

When the switch 304 is opened or set to an OFF state, the state signalling, EN, is a logic 0 and the complementary state signalling, ENB, is a logic 1. On receipt of the state signalling, EN=0, the fifth NMOS transistor 331 decouples the primary current source 332 from the drain terminal of the input PMOS transistor 328. As a result, there is no current for the PMOS mirror to mirror to the output PMOS transistor 326. In this way, the second switching arrangement 334 is configured to selectively disable the second current source 324.

On receipt of the state signalling, EN=0, the sixth NMOS transistor 342 of the first switching arrangement 330 decouples the first current source 325 from the common gate terminal 320. In this way, the first switching arrangement 330 selective disables the first current source 325.

As the first current source 325 and the second current source 324 are disabled, neither the first current, Ibias_ls, nor the second current, Ibias_hs, flow in the OFF state. In other words, the control circuitry does not consume current during the OFF state of the switch 304.

On receipt of the complementary state signalling, ENB=1, the fourth PMOS transistor 336 of the second switching arrangement 334 couples the common source terminal 318 to the second reference voltage terminal 329. As a result, a voltage, $Vs_{M1,M2}$, at the common source terminal 318 of the first and second PMOS transistors 312, 314 is pulled up to a supply voltage of the supply terminal. On receipt of the complementary state signalling, ENB=1, the seventh PMOS transistor 340 of the second switching arrangement 334 couples the source terminal of the third PMOS transistor 316 to the second reference voltage terminal 329. As a result, a voltage, $Vs_{M3}$, at the source terminal of the third PMOS transistor 316 is also pulled up to a supply voltage of the supply terminal.

As no more current is injected through the drive resistor 322 and the voltages, $VS_{M1,M2} = Vs_{M3} = V_{supply}$, the gate-source voltage, $Vgs_{M1,M2}$, of the first and second PMOS transistors 312, 314 equals 0 V. As a result, the first and second PMOS transistors 312, 314 are switched off and their conduction channels forming the channel path of the switch become non-conductive. This zero value of the gate-source voltage, $Vgs_{M1,M2}$, of the first and second PMOS transistors 312, 314 can ensure a proper cut-off of the channel switches 312, 314.

The disclosed switches (such as those of FIGS. 2 and 3) provide several advantages including:
1. The control current of the control circuitry is isolated from the channel path of the switch;
2. The control circuit may hold the switch in an open state without consuming current; and
3. The control circuit can be realised with only one drive resistor.

The disclosed switches may also provide advantages when used in a HV multiplexer such as those found in BMS ICs. When measuring the various voltages of the battery pack, the voltage on the shared bus may change suddenly, for example a step change from measuring a maximum common mode voltage to measuring a minimum common mode voltage. In some switches, such large swings of several tens of Volts on the bus can generate parasitic capacitances that may result in a short period (tens of ns) in which the gate-source voltage of the channel switches remains above the threshold voltage and the switch may remain ON even if commanded OFF. This can be particularly problematic if a second switch of the HV multiplexer has been commanded ON and could result in discharge of a capacitor of the RC filter. The disclosed switches can avoid or reduce this transient problem because the voltages of both the common source terminal and the source terminal of the third MOS transistor are set to the voltage of the second reference voltage terminal when the switch is commanded OFF.

The disclosed switches can find particularly advantageous application in HV multiplexers of BMS ICs providing a battery cell voltage and temperature measurement chain with high accuracy.

The disclosed switches can provide a very high voltage zero-leakage current-control analog switch with zero control current required to keep switch open.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A switch comprising:
a channel path comprising a first MOS transistor and a second MOS transistor arranged in a back to back configuration with a common source terminal and a common gate terminal, wherein a drain terminal of the first MOS transistor defines a first terminal of the channel path and a drain terminal of the second MOS transistor defines a second terminal of the channel path; and
control circuitry comprising:
a third MOS transistor comprising:
a gate terminal coupled to the common source terminal;
a source terminal coupled to the common gate terminal by a resistor; and
a drain terminal coupled to a first reference voltage terminal;
a first current source coupled between the first reference voltage terminal and the common gate terminal and configured to provide a first current;
a second current source coupled between the source terminal of the third MOS transistor and a second reference voltage terminal, and configured to provide a second current greater than the first current; and
a first switching arrangement configured to selectively enable and disable the first current source; and
a second switching arrangement configured to selectively couple the common source terminal to the second reference voltage terminal.

2. The switch of claim 1, wherein:
the first switching arrangement and the second switching arrangement are configured to receive state signalling defining a state of the switch;
the first switching arrangement is configured to:
enable the first current source if the state signalling defines an ON state; and
disable the first current source if the state signalling defines an OFF state; and
the second switching arrangement is configured to:
decouple the common source terminal from the second reference voltage terminal if the state signalling defines an ON state; and
couple the common source terminal to the second reference voltage terminal if the state signalling defines an OFF state.

3. The switch of claim 1, wherein:
a voltage of the first reference voltage terminal is greater than a voltage of the second reference voltage terminal; and
the first MOS transistor, the second MOS transistor and the third MOS transistor are NMOS transistors.

4. The switch of claim 3, wherein the second switching arrangement comprises a fourth NMOS transistor having a gate terminal configured to receive the state signalling, wherein a conduction channel of the fourth NMOS transistor is coupled between the common source terminal and the second reference voltage terminal.

5. The switch of claim 3, wherein the first current source comprises an output PMOS transistor of a PMOS current mirror.

6. The switch of claim 5, wherein:
the first switching arrangement comprises a fifth NMOS transistor having a gate terminal configured to receive the state signalling; and
a conduction channel of the fifth NMOS transistor, a conduction channel of an input PMOS transistor of the PMOS current mirror and a primary current source are coupled in series between the first reference voltage terminal and the second reference voltage terminal such that the PMOS current mirror is configured to mirror a current of the primary current source from the input PMOS transistor to the output PMOS transistor to produce the first current.

7. The switch of claim 1, wherein:
a voltage of the first reference voltage terminal is less than a voltage of the second reference voltage terminal; and
the first MOS transistor, the second MOS transistor and the third MOS transistor are PMOS transistors.

8. The switch of claim 7, wherein the first switching arrangement comprises a sixth NMOS transistor having a gate terminal configured to receive the state signalling, wherein a conduction channel of the sixth NMOS transistor and the first current source are coupled in series between the first reference voltage terminal and the common gate terminal.

9. The switch of claim 7, wherein the second switching arrangement comprises a fourth PMOS transistor having a gate terminal configured to receive the state signalling wherein a conduction channel of the fourth PMOS transistor is coupled between the common source terminal and the second reference voltage terminal.

10. The switch of claim 9, wherein the second switching arrangement further comprises a seventh PMOS transistor having a gate terminal configured to receive the state signalling wherein a conduction channel of the seventh PMOS transistor is configured is coupled between the source terminal of the third PMOS transistor and the second reference voltage.

11. The switch of claim 7, wherein the second current source comprises an output PMOS transistor of a PMOS current mirror.

12. The switch of claim 11, wherein:
the second switching arrangement further comprises a fifth NMOS transistor having a gate terminal configured to receive the state signalling; and
a conduction channel of the fifth NMOS transistor, a conduction channel of an input PMOS transistor of the PMOS current mirror and a primary current source are coupled in series between the first reference voltage terminal and the second reference voltage terminal such that the PMOS current mirror is configured to mirror a current of the primary current source from the input PMOS transistor to the output PMOS transistor to produce the second current.

13. The switch of claim 1 further comprising a Zener diode coupled between the gate terminal of the third MOS transistor and the source terminal of the third MOS transistor and arranged to provide over-voltage gate protection for the third MOS transistor.

14. A high voltage multiplexer comprising one or more switches of claim 1.

15. A battery management system comprising the switch of claim 1.

16. The switch of claim 1 further comprising a Zener diode coupled between the gate terminal of the third MOS transistor and the source terminal of the third MOS transistor and arranged to provide over-voltage gate protection for the third MOS transistor.

17. The switch of claim 2, wherein:
a voltage of the first reference voltage terminal is greater than a voltage of the second reference voltage terminal; and
the first MOS transistor, the second MOS transistor and the third MOS transistor are NMOS transistors.

18. The switch of claim 17, wherein the second switching arrangement comprises a fourth NMOS transistor having a gate terminal configured to receive the state signalling defining a state of the switch, wherein a conduction channel of the fourth NMOS transistor is coupled between the common source terminal and the second reference voltage terminal.

19. The switch of claim 18, wherein:
the state signalling comprises a two-level signal;
the fourth NMOS transistor is configured to receive the state signalling with a first level representing an ON state and a second level representing an OFF state;
the first switching arrangement comprises a fifth NMOS transistor having a gate terminal configured to receive the state signalling as complementary state signalling with the first level representing the OFF state and the second level representing the ON state; and
a conduction channel of the fifth NMOS transistor, a conduction channel of an input PMOS transistor of the PMOS current mirror and a primary current source are coupled in series between the first reference voltage terminal and the second reference voltage terminal such that the PMOS current mirror is configured to mirror a current of the primary current source from the input PMOS transistor to the output PMOS transistor to produce the first current.

20. The switch of claim 11, wherein:
a conduction channel of an input PMOS transistor of the PMOS current mirror and a primary current source is coupled in series between the first reference voltage terminal and the second reference voltage terminal such that the PMOS current mirror is configured to mirror the primary current source from the input PMOS transistor to the output PMOS transistor to produce the second current.

* * * * *